(12) United States Patent
Kubota et al.

(10) Patent No.: US 9,279,184 B2
(45) Date of Patent: Mar. 8, 2016

(54) METHOD OF FORMING A PATTERN AND SUBSTRATE PROCESSING SYSTEM

(71) Applicant: Tokyo Electron Limited, Tokyo (JP)

(72) Inventors: Kazuhiro Kubota, Miyagi (JP); Ryukichi Shimizu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/406,809

(22) PCT Filed: Jul. 10, 2013

(86) PCT No.: PCT/JP2013/068883
§ 371 (c)(1),
(2) Date: Dec. 10, 2014

(87) PCT Pub. No.: WO2014/010630
PCT Pub. Date: Jan. 16, 2014

(65) Prior Publication Data
US 2015/0167163 A1 Jun. 18, 2015

Related U.S. Application Data

(60) Provisional application No. 61/672,399, filed on Jul. 17, 2012.

(30) Foreign Application Priority Data
Jul. 11, 2012 (JP) .................................. 2012-155359

(51) Int. Cl.
*C23F 1/02* (2006.01)
*C23C 16/455* (2006.01)
(Continued)

(52) U.S. Cl.
CPC .......... *C23C 16/45525* (2013.01); *C23C 16/045* (2013.01); *C23C 16/345* (2013.01); *C23C 16/402* (2013.01); *C23C 16/45542* (2013.01); *H01J 37/32935* (2013.01);
(Continued)

(58) Field of Classification Search
CPC .................. H01L 21/31116; H01L 21/31144; H01J 37/32192
USPC .......... 216/39, 67, 79; 438/714, 724; 156/345.48
See application file for complete search history.

(56) References Cited

U.S. PATENT DOCUMENTS 8,242,031 B2 *   8/2012  Mallick et al. ............... 438/787
8,791,020 B2 *   7/2014  Mori et al. ................... 438/694
(Continued)

FOREIGN PATENT DOCUMENTS

JP   2008-251897   10/2008
JP   2010-103497    5/2010
(Continued)

*Primary Examiner* — Lan Vinh
*Assistant Examiner* — Maki Angadi
(74) *Attorney, Agent, or Firm* — IPUSA, PLLC

(57) ABSTRACT

A method of forming a pattern is provided. The method includes an etching step of forming a predetermined pattern in a silicon-containing film by etching the silicon-containing film deposited on a substrate through a mask by plasma generated from an etching gas containing a fluorocarbon gas, and a film deposition step of depositing a silicon oxide film or a silicon nitride film on a surface of the predetermined pattern by oxidizing or nitriding a silicon-containing layer adsorbed on the surface of the predetermined pattern by supplying a silicon compound gas, by using plasma generated from an oxidation gas or a nitriding gas.

9 Claims, 12 Drawing Sheets

(51) Int. Cl.

| | |
|---|---|
| *C23C 16/04* | (2006.01) |
| *C23C 16/34* | (2006.01) |
| *C23C 16/40* | (2006.01) |
| *H01L 21/02* | (2006.01) |
| *H01L 21/311* | (2006.01) |
| *H01J 37/32* | (2006.01) |
| *H01L 21/768* | (2006.01) |
| *H01L 21/67* | (2006.01) |

(52) U.S. Cl.
CPC ....... *H01L 21/0217* (2013.01); *H01L 21/0228* (2013.01); *H01L 21/02164* (2013.01); *H01L 21/02211* (2013.01); *H01L 21/02219* (2013.01); *H01L 21/02274* (2013.01); *H01L 21/31116* (2013.01); *H01L 21/31144* (2013.01); *H01L 21/67069* (2013.01); *H01L 21/76816* (2013.01); *H01J 2237/3347* (2013.01)

(56) References Cited

U.S. PATENT DOCUMENTS 8,809,199 B2 * 8/2014 Nishizuka .................... 438/724
2008/0008975 A1 * 1/2008 Oosterlaken et al. ........... 432/17

FOREIGN PATENT DOCUMENTS

| JP | 2011-526078 | 9/2011 |
| JP | 2012-049290 | 3/2012 |
| WO | 2009/158180 | 12/2009 |

* cited by examiner

FIG.7

| PROCESS<br>MEASUREMENT OBJECT | ETCHING PROCESS | ETCHING + ALD PROCESS ||
|---|---|---|---|
| | | TARGETED FILM THICKNESS OF 5 nm | TARGETED FILM THICKNESS OF 10 nm |
| TOP CD [nm] | 41 | 35 | 31 |
| BOWING CD [nm] | 49 | 41 | 32 |
| DEPTH h [nm] | 2112 | 2116 | 2108 |
| ASPECT RATIO AR | 51.6 | 60.3 | 68.0 |

METHOD OF FORMING A PATTERN AND SUBSTRATE PROCESSING SYSTEM

CROSS-REFERENCE TO RELATED APPLICATIONS

The present application is a National Stage of International Application No. PCT/JP2013/068883 filed on Jul. 10, 2013, claiming priority based on Japanese Patent Application No. 2012-155359 filed on Jul. 11, 2012, and U.S. Provisional Application No. 61/672,399 filed on Jul. 17, 2012, the entire contents of which are hereby incorporated by reference.

TECHNICAL FIELD

The present invention relates to a method of forming a pattern and a substrate processing system.

BACKGROUND ART

When forming a deep hole (a contact hole) having a high aspect ratio by plasma etching, an amount of radicals reaching a bottom of the hole decreases as the bottom of the hole becomes deeper, and an etching rate decreases.

When the etching rate decreases in a depth direction as the bottom of the hole becomes deeper, a bowing shape is formed in the hole that has a hole diameter larger in a lower position than in an upper position (see [b] in FIG. 2). Moreover, when a side wall of the hole is etched as well as the bottom of the hole during the etching, an aspect ratio thereof decreases because of an increased critical dimension value (Critical Dimension) that is a diameter of the top of the hole, and desired semiconductor device properties cannot be obtained.

In the meantime, there are a variety of methods for depositing a film, and for example, Patent Document 1 discloses a technique that protects a device by depositing a dense dielectric layer on the device by an ALD (Atomic Layer Deposition) method.

PRIOR ART DOCUMENTS

Patent Documents

Patent Document 1: Japanese Laid-Open Patent Application Publication No. 2011-526078

SUMMARY OF THE INVENTION

Problem to be Solved by the Invention

However, in Patent Document 1, performing a film deposition process to modify a pattern shape formed by etching is not considered. Hence, in Patent Document 1, there is no effect of modifying the pattern shape formed by the etching.

Accordingly, one embodiment of the present invention aims at providing a method of forming a pattern and a substrate processing system that can form a pattern having a preferable shape on a substrate.

Means for Solving the Problem

According to an embodiment of the present invention, there is provided a method of forming a pattern.

The method includes an etching step of forming a predetermined pattern in a silicon-containing film by etching the silicon-containing film deposited on a substrate through a mask by plasma generated from an etching gas containing a fluorocarbon gas, and a film deposition step of depositing a silicon oxide film or a silicon nitride film on a surface of the predetermined pattern by oxidizing or nitriding a silicon-containing layer adsorbed on the surface of the predetermined pattern by supplying a silicon compound gas, by using plasma generated from an oxidation gas or a nitriding gas.

Advantageous Effect of the Invention

According to an embodiment of the present invention, a pattern having a preferable shape can be formed on a substrate.

BRIEF DESCRIPTION OF THE DRAWINGS

FIG. 7 is a chart showing various measured values indicating hole profiles under conditions with or without the ALD process;

EMBODIMENTS FOR IMPLEMENTING THE INVENTION

Figure 1A:
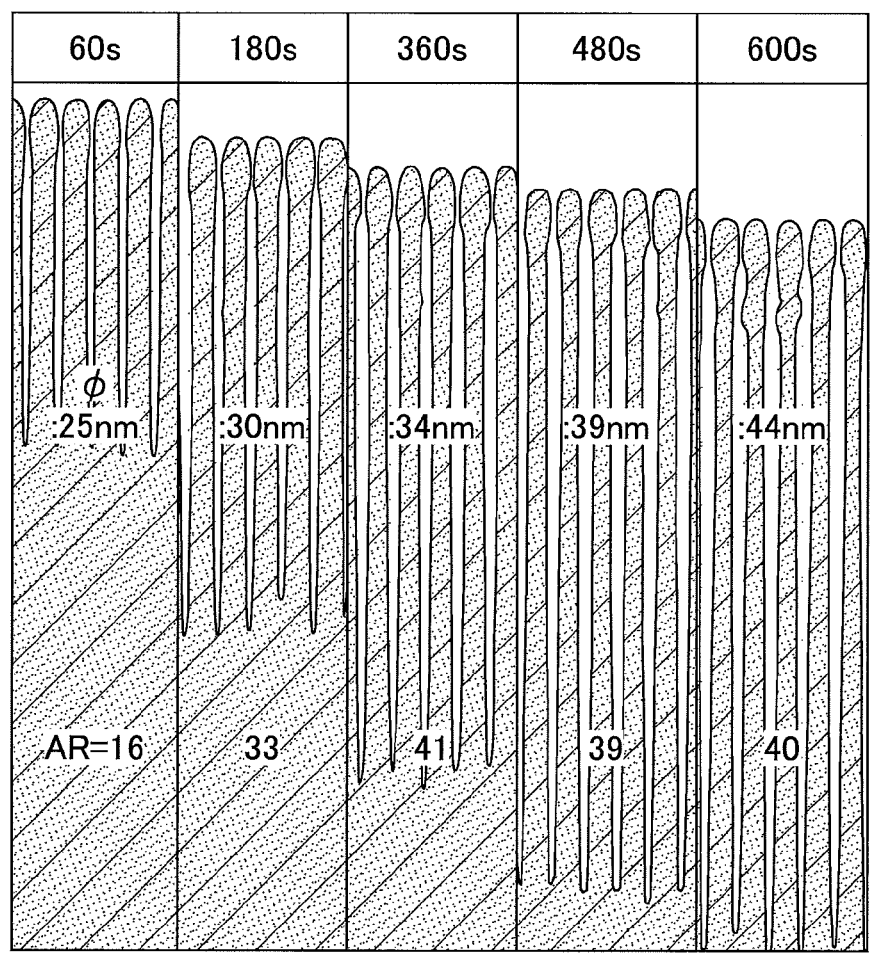
FIG. 1A is a diagram illustrating a cross-sectional shape of a hole with respect to etching time.

In the following, embodiments of the present invention are described with reference to the accompanying drawings. Note that elements having substantially the same functions or features may be given the same reference numerals and overlapping descriptions thereof may be omitted.

[Introduction]

When forming a deep contact hole having a high aspect ratio (AR) by plasma etching, an amount of radicals that reaches a bottom of the hole decreases as the bottom of the hole becomes deeper, and an etching rate decreases. A description is given below of this phenomenon with reference to FIGS. 1 and 2. FIG. 1 is a diagram illustrating a relationship between depths of etched contact holes and etching rates. FIG. 2 is a diagram for explaining a definition of an aspect ratio of a contact hole and a bowing shape.

Formerly, a required aspect ratio of the contact hole was about 50. As illustrated in [a] of FIG. 2, the aspect ratio AR is expressed by a depth h of a hole relative to a diameter φ of the opening portion (top CD) of the hole. For example, when the diameter φ of the hole is 40 nm, and the depth h of the hole is 2 μm, the aspect ratio is 50.

In recent years, along with further microfabrication, forming a narrow hole having a diameter φ of about 20 nm has been demanded. For example, when the diameter is 20 nm and the depth h of the hole is 2 μm, the aspect ratio is 100.

However, as the etching hole becomes deeper, the etching rate decreases. The etching rate is an amount that can be etched per unit time. For example, FIG. 1A shows cross-sectional shapes of the holes in response to the etching times when forming a hole in a silicon oxide film ($SiO_2$) by the etching. In this experiment, among parallel flat plate type plasma apparatuses, a parallel flat plate type etching apparatus (see FIG. 10) is used in which two frequencies are applied to the lower electrode. Process conditions of the etching are as follows: a pressure is 2.66 Pa; a frequency of high frequency power HF for plasma generation is 60 MHz and a power thereof is 1200 W; a frequency of high frequency power LF for ion attraction is 400 kHz and a power thereof is 4500 W; and a gas species is a mixed gas of $C_4F_6/C_4F_8/Ar/O_2$. Under the conditions, the silicon oxide film is etched by using poly-silicon as a mask. FIG. 1A illustrates numerical values of cross-sectional shapes of the holes, the diameters φ of the holes, and the aspect ratios AR when the etching times are 60 seconds, 180 seconds, . . . 600 seconds from the left side. According to the experimental results, as the depths h of the holes become deeper, the diameters φ of the holes become larger and the aspect ratios AR vary more widely.

Figure 1B:
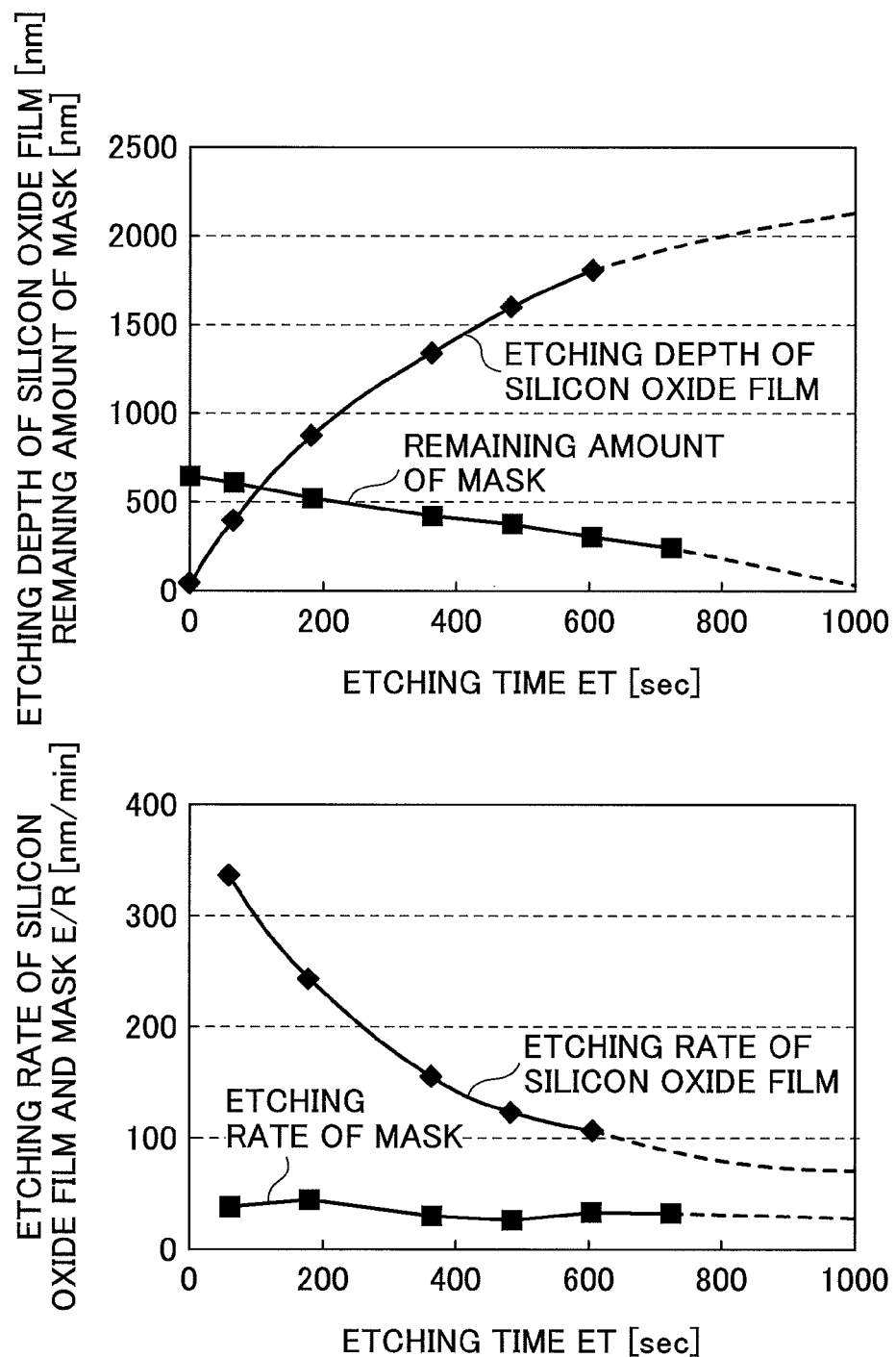
FIG. 1B is a diagram illustrating a depth of a hole, a remaining quantity of mask, and an etching rate with respect to the etching time.
Figure 2:
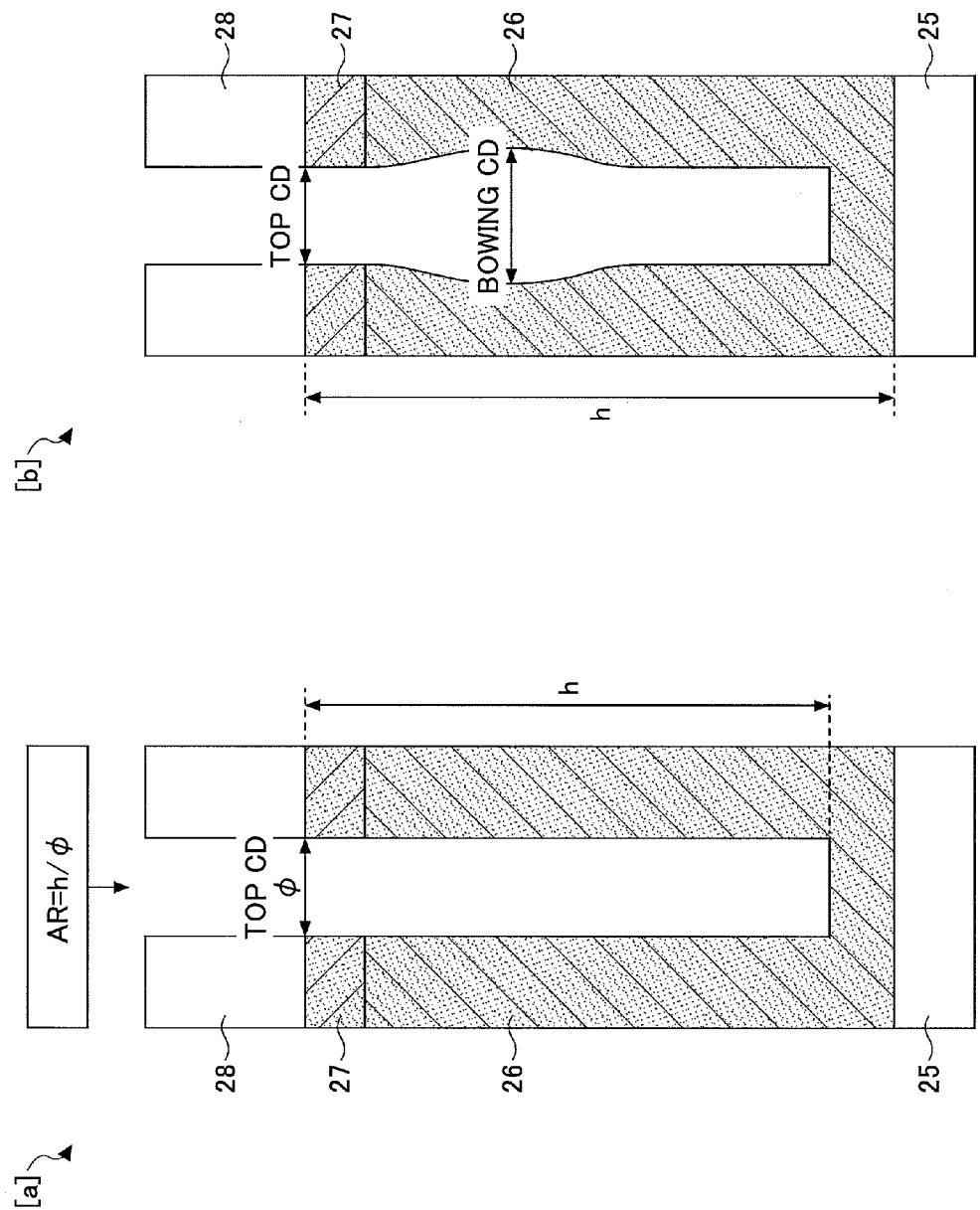
FIG. 2 is a vertical diagram for explaining an aspect ratio and a bowing shape.

An upper diagram in FIG. 1B shows a depth of a hole of an etched silicon oxide film (vertical axis) and a remaining amount of a poly-silicon mask (vertical axis) having a pattern formed therein for etching the silicon oxide film corresponding to etching time (horizontal axis). A lower diagram in FIG. 1B shows an etching rate of the silicon oxide film and an etching rate of the mask as etching rates (vertical axis) corresponding to the etching time (ET).

According to the upper diagram and the lower diagram in FIG. 1B, it is noted that the etching rate of the silicon oxide film decreases as the etching time ET increases and the hole deepens and that hole becomes difficult to be etched. Furtheintore, the etching rate of the mask is almost constant without respect to the etching time ET, and a reduction of the poly-silicon mask is almost constant.

As discussed above, when a deep hole having a small diameter is formed by the etching, the etching rate decreases in a depth direction and a bowing shape (see [b] in FIG. 2) that has a diameter larger in a middle portion (bowing CD) than in an upper portion (top CD) in the depth direction is formed.

In addition, a side wall is etched during the etching, and CD (critical dimension) of the hole is broadened. This prevents a hole having a desired aspect ratio from being formed, and desired semiconductor device properties cannot be obtained. For example, when the top CD is φ 25 nm and the depth of the hole is 2.5 μm, the aspect ratio becomes 100 (=2.5 μm/φ 25 nm). However, when the side wall is etched during the etching and the top CD is broadened to φ 40 nm, the aspect ratio reduces to 62.5 (=2.5 μm/φ 40 nm), and the desired semiconductor device properties cannot be obtained. Although a description is given of an example of using the poly-silicon mask as the etching mask, using a resist mask is also possible.

Therefore, in the method of forming the pattern according to the embodiments, $SiO_2$ is deposited on a surface of a hole formed by the etching, by the ALD method. This makes it possible to modify the expansion of the diameter CD of the hole and to correct the bowing shape of the hole. In this manner, the embodiments propose a method of forming a pattern that performs a film deposition process for the purpose of modifying the etching shape after the etching process.

Figure 3:
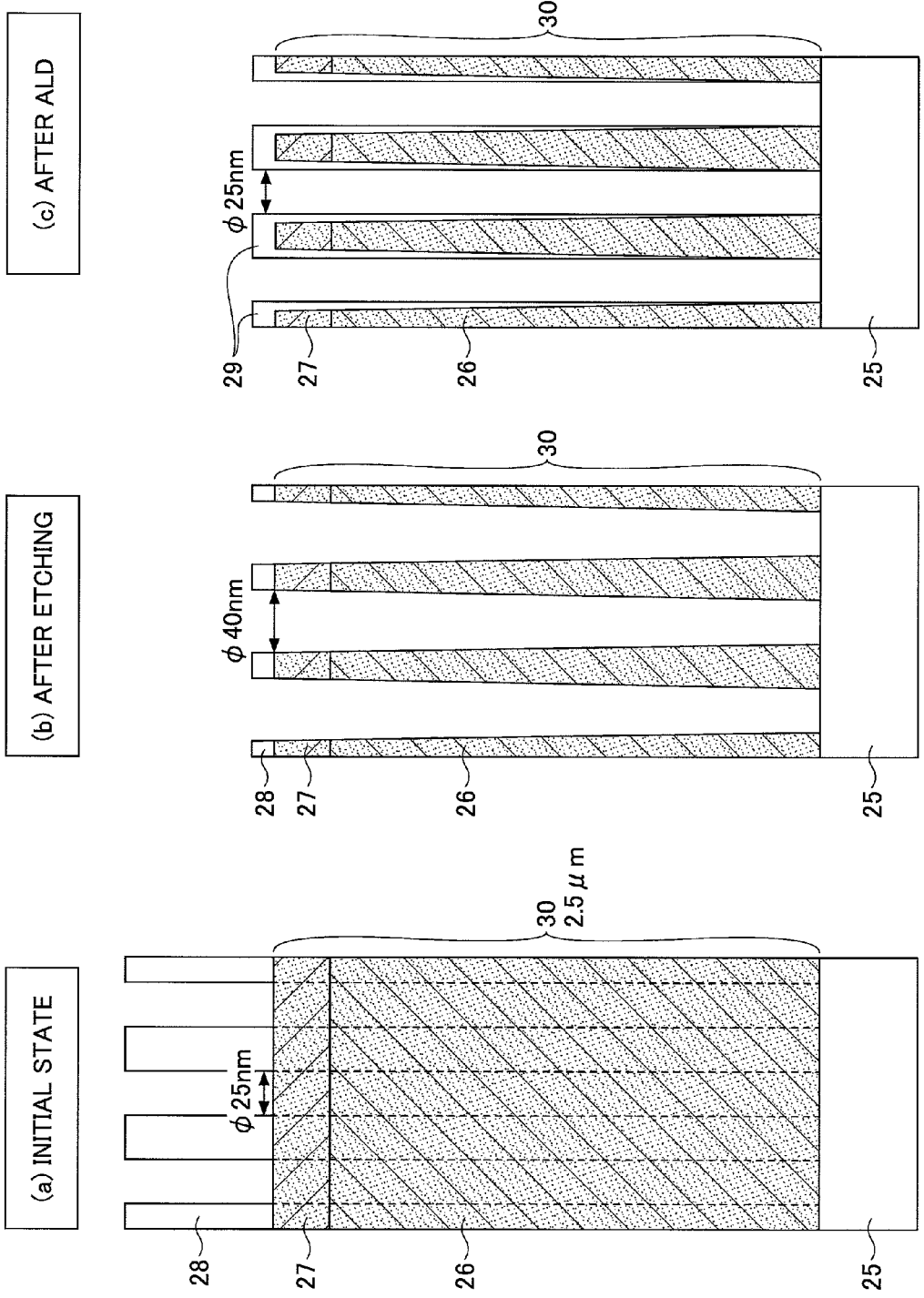
FIG. 3 is a diagram for explaining a method of forming a pattern according to first and second embodiments.

In the method of forming a pattern of the embodiments, an etching process of "(a) INITIAL STATE" illustrated in FIG. 3 is performed on a silicon oxide film 26 and a silicon nitride film 27. Here, although both of the silicon oxide film 26 and the silicon nitride film 27 is etched, respectively, a film to be etched may be the silicon oxide film 26 alone, or the silicon nitride film 27 alone. The silicon oxide film 26 and the silicon nitride film 27 are hereinafter called a silicon-containing film 30 as a generic name thereof.

As a result of etching the silicon-containing film 30, the hole shapes having broadened CDs (the diameter φ of the hole) are formed as shown in "(b) AFTER ETCHING" of FIG. 3. Then, a modifying film 29 is deposited on surfaces of the formed holes as illustrated in "(c) AFTER ALD" of FIG. 3. This improves the aspect ratio by modifying the hole and narrowing the CDs of the holes again. Moreover, this causes the shapes of the side walls of the holes to be formed vertically. FIG. 3 illustrates a state in which a hole diameter φ of a design value is set at 25 nm ("(a) INITIAL STATE" in FIG. 3), and is modified to become 25 nm again ("(c) AFTER ALD" in FIG. 3) even after being broadened to 40 nm during the etching process ("(b) AFTER ETCHING" in FIG. 3). A detailed description is given below of the method of forming the pattern according to the embodiments in the order of the first embodiment and the second embodiment.

First Embodiment

Figure 4:
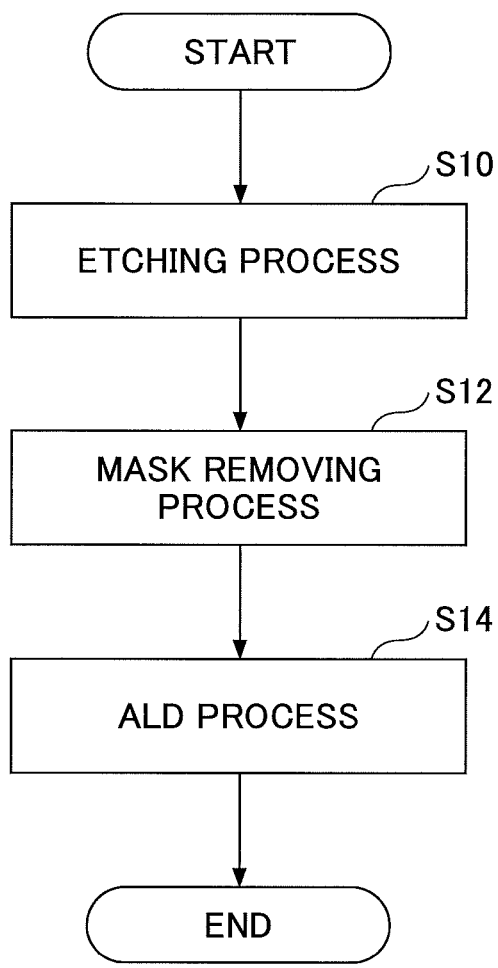
FIG. 4 is a flowchart illustrating a pattern forming process according to the first embodiment.

In the method of forming the pattern according to the first embodiment, as illustrated in "(a) INITIAL STATE" of FIG. 3, a process of forming a pattern illustrated in FIG. 4 is performed in an initial state in which the silicon oxide film ($SiO_2$) 26, the silicon nitride film (SiN) 27 and a poly-silicon mask 28 are sequentially deposited on a silicon substrate (Si) 25 from the bottom. FIG. 4 is a flowchart illustrating the method of forming the pattern according to the first embodiment. Here, a hole pattern having a diameter of 25 nm is formed in the poly-silicon mask 28 by using photolithography technology.

[Process of Forming Pattern]
(Etching Process)
After starting the process of forming the pattern illustrated in FIG. 4, an etching process is performed in step S10. In this experiment, a lower two-frequency application type parallel flat plate etching apparatus (see FIG. 10) is used among parallel flat plate plasma processing apparatuses. Process conditions of the etching are as follows: a pressure is 2.27 Pa; a frequency of the high frequency power HF for plasma generation is 60 MHz and a power thereof is 1500 W; a frequency of the high frequency power LF for ion attraction is 400 kHz and a power thereof is 7800 W; and a gas species is a mixed gas of $C_4F_6/C_3F_8/Ar/O_2$. Under the conditions, the silicon-containing film 30 (the silicon nitride film 27 and the silicon oxide film 26) is etched through the poly-silicon mask 28.

(Mask Removing Process)
Next, in step S12, a mask removing process is performed. The mask removing process is performed when the mask for etching process is a resist mask. In other words, when the mask for etching process is not a resist mask, this step can be omitted.

(Film Deposition Process)
Subsequently, in step S14, a film deposition process by ALD (ALD process) is performed. Here, a microwave plasma apparatus (see FIG. 11) is used as a film deposition apparatus.

Figure 5:
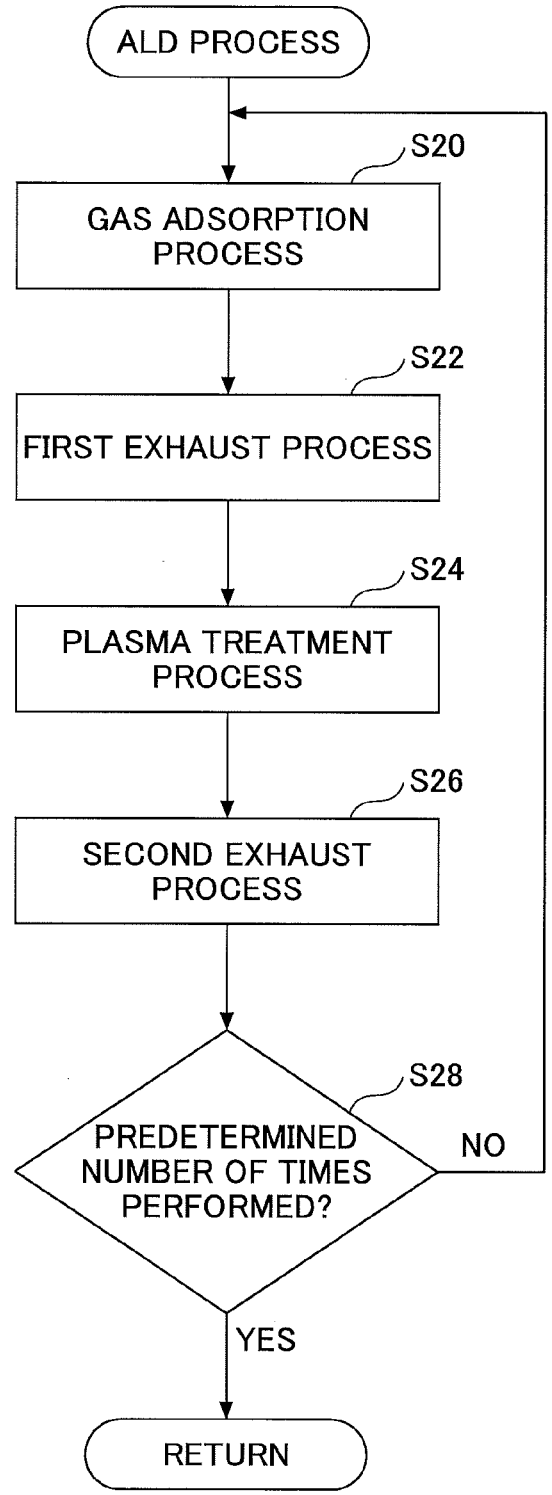
FIG. 5 is a flowchart illustrating an ALD process according to the first embodiment.

As illustrated in FIG. 5, the film deposition process (step S14) is performed in the order of a gas adsorption process of step S20, a first exhaust process of step S22, a plasma treatment process of step S24, and a second exhaust process of step S26.

1. Gas Adsorption Process (Step S20)

As illustrated in FIG. 5, at the gas adsorption process, BTBAS (bis-tertiaryl-buthyl-amino-silane) and Ar gas are supplied as a precursor gas, a part of gases for film deposition. This causes silicon atoms contained in BTBAS to be chemically adsorbed on the surfaces of the holes. The pressure is controlled to become 133 Pa, and BTBAS and argon gas (Ar) are supplied at flow rates of 30 sccm and 540 sccm, respectively.

2. First Exhaust Process (Step S22)

In the first exhaust process, the gas for film deposition excessively adsorbed on the surfaces of the holes is removed. More specifically, in the first exhaust process, the process chamber is evacuated by using an exhaust device while supplying argon gas (Ar) as a purge gas. This enables silicon (Si) chemically adsorbed on the surfaces of the holes in surplus to be purged (removed). This causes atomic layers of silicon (Si) to be formed on the surfaces of the holes. The term "atomic layer" includes not only a layer that is one atom thick of silicon atom (Si) but also a plurality of atoms thick of silicon atom (Si).

The pressure is controlled to become 266 Pa or higher and argon gas (Ar) is supplied at a flow rate of 540 sccm as an example of the process conditions in the first exhaust process.

3. Plasma Treatment Process (Step S24)

In the plasma treatment process, a plasma treatment by a microwave is performed. More specifically, in the plasma treatment process, oxygen gas ($O_2$) is supplied into the process chamber as a reactive gas together with argon gas (Ar) as a plasma processing gas. Moreover, the microwave is supplied into the process chamber. Electric field energy of the microwave causes the plasma processing gas to be ionized and dissociated, thereby generating plasma. Oxygen radicals (O*) in the generated plasma oxidize the atomic layers adsorbed on the surfaces of the holes. This causes a silicon oxide film ($SiO_2$) to be deposited on the surfaces of the holes.

The pressure is controlled to become 133 Pa, and oxygen gas ($O_2$) and argon gas (Ar) are supplied at flow rates of 60 sccm and 540 sccm, respectively. At this time, electric power of the microwave of 3 kW having a frequency of, for example, 2.45 GHz, is supplied.

Here, instead of oxygen gas ($O_2$), ozone ($O_3$), dinitrogen monoxide ($N_2O$), nitric oxide ($N_3O$), carbon monoxide (CO), carbon dioxide ($CO_2$) or a gas containing a chemical compound such as a combination of the above gases can also oxidize the atomic layers adsorbed on the surfaces of the holes by oxygen radicals (O*) in the plasma. These gases are examples of oxidation gases. Furthermore, another inactive gas can be used instead of argon gas (Ar).

4. Second Exhaust Process (Step S26)

In the second exhaust process, unreacted plasma treatment gas is removed. More specifically, in the second exhaust process, the process chamber is evacuated by using an exhaust device while supplying argon gas (Ar) as well as the first exhaust process. This causes the unreacted plasma gas to be evacuated.

The pressure is controlled to become 266 Pa or higher, and argon gas (Ar) is supplied at a flow rate of 540 sccm as well as the first exhaust process as an example of process conditions in the second exhaust process.

At step S28 in FIG. 5, when a unit of performing each of the processes of the above 1 through 4 one time is made one cycle, it is determined whether the cycle is performed a predetermined number of times. For example, when a silicon oxide film ($SiO_2$) 5 nm thick is desired to be deposited on one side wall of the hole, a repeat count is obtained by dividing 5 nm by a film thickness that can be deposited in one cycle. For example, a silicon oxide film having a desired film thickness can be deposited by depositing the atomic layers in a layer-by-layer manner in a range of 30 to 40 times.

[Experimental Results]

Figure 6:
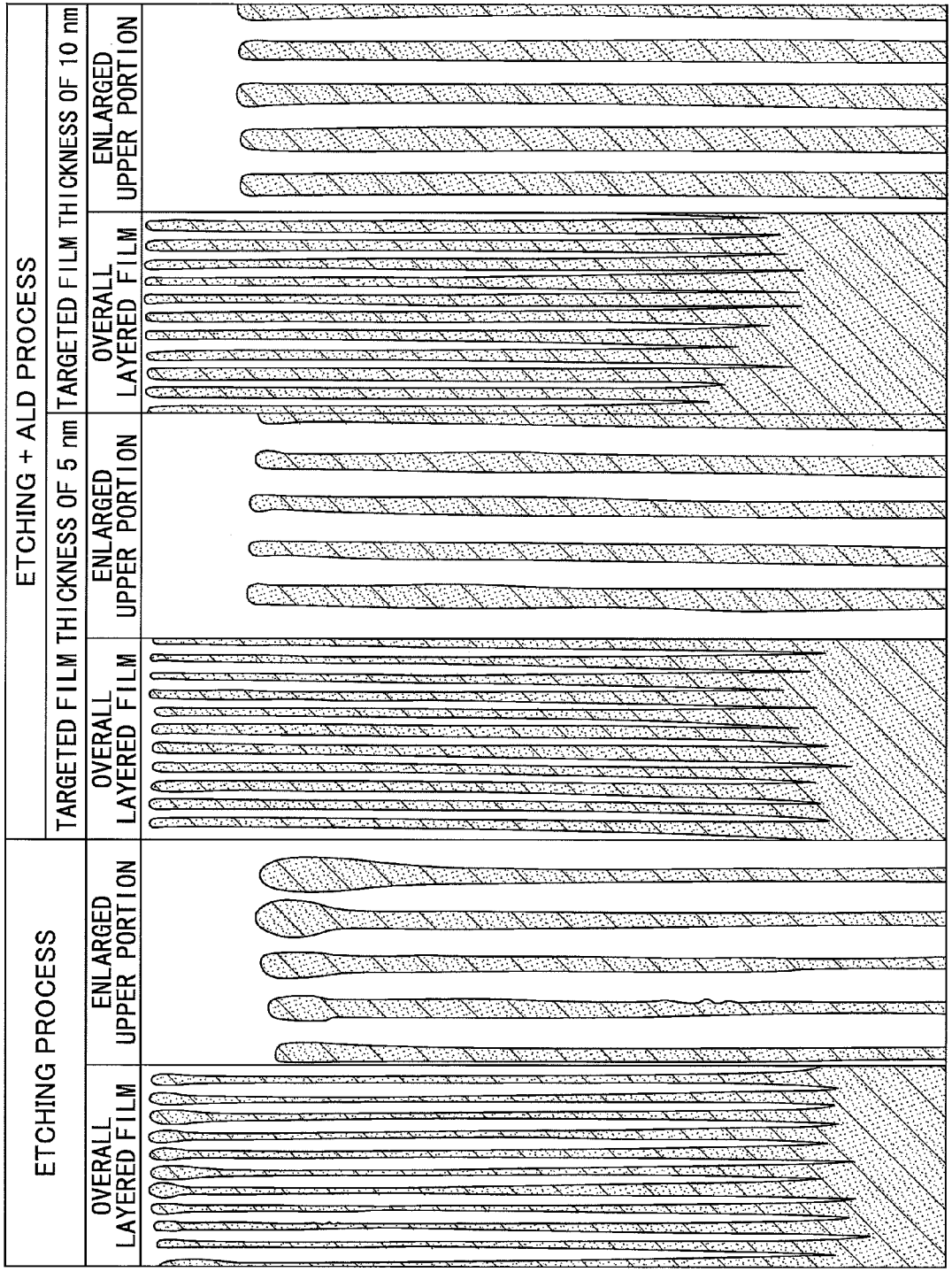
FIG. 6 is a diagram illustrating hole shapes under conditions with or without an ALD process according to an embodiment.

FIG. 6 illustrates experimental results according to the above method of forming the pattern. The "ETCHING PROCESS" shown on the left side in FIG. 6 illustrates a cross-sectional diagram of the holes after performing the etching process (step S10) of FIG. 4 on the silicon-containing film 30 (the silicon oxide film 26 and the silicon nitride film 27) as a film to be etched. At this time, when a resist mask is used instead of the poly-silicon mask 28, the mask may be removed by performing the mask removing process (step S12).

The "ETCHING PROCESS+ALD PROCESS" shown on the right side of FIG. 6 illustrates a vertical section of the holes in a state of being modified by the film deposition process (step S14) by ALD after performing the etching process (step S10) in the silicon-containing film 30 (the silicon oxide film 26 and the silicon nitride film 27) as the film to be etched. The "ETCHING PROCESS+ALD PROCESS" illustrates cases of repeating the cycle of the above processes 1 through 4 a predetermined times corresponding to film thickness targets of depositing the silicon oxide films 5 nm thick (on the left side) and 10 nm thick (on the right side) on the side walls on one side of the holes.

The left depictions illustrate overall views of the holes formed in the film, and the right depictions illustrate enlarged views of the upper portions of the holes with respect to each of the "ETCHING PROCESS" and the "ETCHING PROCESS+ALD PROCESS". According to the depictions, the bowing shapes of the holes were more modified when performing the film deposition process by the ALD than when not performing the film deposition process by the ALD, and the side walls of the holes could be formed more vertically. In addition, the CDs were able to be formed narrower when performing the film deposition process by the ALD than when not performing the film deposition process by the ALD.

FIG. 7 shows various numerical values indicating the experimental results. FIG. 7 shows measured results of a top CD that is a diameter of the top of the hole, a bowing CD that is a diameter of an intermediate part, a depth h and an aspect ratio AR (see [b] in FIG. 2). According to the results, the aspect ratio of the hole obtained in the "ETCHING PROCESS+ALD PROCESS" was greater than that obtained in the "ETCHING PROCESS". This is why the hole became narrow relative to the depth h and the CD value became small by the ALD process.

Moreover, the difference between the bowing CD and the top CD obtained in the "ETCHING PROCESS+ALD PROCESS" became smaller than the difference between the bowing CD and the top CD obtained in the "ETCHING PROCESS". In other words, not only did the holes become narrow by the ALD process, but the bowing shapes also improved and the wall surfaces of the holes became more vertical.

As discussed above, according to the method of forming the pattern of the embodiment, a diameter and a shape of the hole can be modified by depositing a dense and conformal silicon oxide film on a surface of the hole. Moreover, a thickness of the silicon oxide film deposited on the hole can be adjusted.

(Modifications of Film Deposition Process)

A silicon nitride film can be deposited instead of the silicon oxide film as a modification of a film deposition process (step S14) by the ALD. With respect to the relationship between the film to be etched and the film layered by the ALD, when the film to be etched is a silicon oxide film, although the film deposited by the ALD may be either a silicon oxide film or a silicon nitride film, the silicon oxide film is more preferable. In addition, when the film to be etched is a silicon nitride film, although the film deposited by the ALD may be either a silicon oxide film or a silicon nitride film, the silicon nitride film is more preferable. In other words, the film to be etched and the film to be layered by the ALD is preferably the same as the film to be deposited by the ALD.

When depositing a silicon nitride film, a microwave plasma device (see FIG. 11) is also used as a film deposition apparatus. When depositing the silicon nitride film, basically, a cycle constituted of the processes of 1 through 4 (steps S20, S22, S24 and S26) in FIG. 5 is repeated a predetermined number of times. Here, process conditions in depositing the silicon nitride film are mainly described.

1. Gas Adsorption Process

When depositing a silicon nitride film, in the gas adsorption process of step S20 in FIG. 5, DCS (Dichlorosilane) that is a precursor gas is supplied on the surfaces of the holes. This causes silicon (Si) contained in DCS to chemically adsorb on the surfaces of the holes.

The pressure is controlled to become 400 Pa, and DCS, argon gas (Ar) and nitrogen gas ($N_2$) are supplied at flow rates of 280 sccm, 900 sccm and 900 sccm, respectively.

2. First Exhaust Process

Next, in the first exhaust process, nitrogen gas ($N_2$), ammonia gas ($NH_3$), and argon gas (Ar) are supplied to the surfaces of the holes. This causes silicon (Si) chemically adsorbed on the surfaces of the holes excessively to be removed, and the atomic layers of silicon (Si) are formed thereon in the first exhaust process.

The pressure is controlled to become 266 Pa, and nitrogen gas ($N_2$), ammonia gas ($NH_3$) and argon gas (Ar) are supplied at flow rates of 900 sccm, 400 sccm and 900 sccm, respectively, as an example of process conditions in the first exhaust process.

3. Plasma Treatment Process

Subsequently, in the plasma treatment process, nitrogen gas ($N_2$) and ammonia gas ($NH_3$) are supplied to the surfaces of the holes together with argon gas (Ar) as a reactive gas, and a microwave is supplied into the process chamber. This causes a plasma treatment by the microwave, and a silicon nitride film (SiN) is deposited on the surfaces of the holes. The silicon nitride film (SiN) is an example of the modifying films 29 for modifying the hole shape illustrated in "(c) AFTER ALD" of FIG. 3.

The pressure is controlled to become 667 Pa, and nitrogen gas ($N_2$), ammonia gas ($NH_3$) and argon gas (Ar) are supplied at 900 sccm, 400 sccm and 900 sccm, respectively, as an example of process conditions in the plasma treatment process. Nitrogen gas ($N_2$) and ammonia gas ($NH_3$) are examples of a nitriding gas. At this time, for example, a microwave having a frequency of 2.45 GHz and a power of 4 kW is supplied.

4. Second Exhaust Process

After the plasma treatment, in the second exhaust process, unreacted plasma processing gas is removed. More specifically, in the second exhaust process, the process chamber is evacuated by using an exhaust device while supplying argon gas (Ar) as well as the first exhaust process. This causes the unreacted plasma processing gas to be evacuated.

The pressure is controlled to become 266 Pa as well as the first exhaust process, and nitrogen gas ($N_2$), ammonia gas ($NH_3$) and argon gas (Ar) are supplied at the same flow rate as those in the first exhaust process, as an example of process conditions in the second exhaust process.

According to the modifications described above, the film deposition apparatus supplies plasma together with a reactive gas such as nitrogen gas ($N_2$) or ammonia gas ($NH_3$) to the surfaces of the holes, thereby nitriding the surfaces of the holes. This causes a silicon nitride film (SiN) to be deposited on the wall surfaces of the holes.

According to this, the hole diameter and the hole shape can be modified by depositing a dense and conformal silicon nitride film on the surfaces of the holes. Moreover, the thickness of the silicon nitride film deposited on the holes can be adjusted. Here, a film deposition process using a MLD (Molecular Layer Deposition) method may be used instead of the film deposition method using the ALD method. According to this, the silicon oxide film and the silicon nitride film can be also deposited on the surfaces of the holes, and the hole diameter and the hole shape can be modified.

Octamethyl cyclotetrasiloxane (OMCTS) is taken as another example of the precursor gas. Furthermore, in addition to OMCTS, by using a precursor gas such as dimethoxydimethylsilane $(CH_3)_2$—Si—$(O-CH_3)_2$ containing a general formula $R_x$—Si—$(OR')_y$ (in the formula, each R is H, $CH_3$, $CH_2CH_3$ or another alkyl group; each R' is $CH_3$, $CH_2CH_3$ or another alkyl group; x is 0 through 4; y is 0 through 4; and x+y=4), a thin conformal layer can be deposited by a proper process window. Other available precursor gases include an organo disiloxane such as 1,3-dimethyldisiloxane $(CH_3—SiH_2—O—SiH_2—CH_3)$, 1,1,3,3-tetramethyldisiloxane $((CH_3)_2—SiH—O—SiH—(CH_3)_2)$, and hexamethyldisiloxane $((CH_3)_3—Si—O—Si—(CH_3)_3)$ containing a structure of $(R_x—Si—O—Si—R_y)_z$. Other available precursor gases include a cyclic organo siloxane $(R_x—Si—O)_y$ (in the formula, y is greater than 2; x is 1 through 2; and $R_x$ is $CH_3$, $CH_2CH_3$ or another alkyl group). Available cyclic organic silicon compounds can include a cyclic structure containing equal to or more than three silicon atoms, and the cyclic structure can further contain one or a plurality of oxygen atoms. A commercially available cyclic organic silicon compound contains an alternating silicon atom and oxygen atom, and a nucleus containing one or two alkyl group bonded to the silicon atom.

For example, the cyclic organic silicon compound can contain at least one of the following compounds: hexamethyl cyclotrisiloxane $(—Si(CH_3)_2—O—)_3$-cyclic, 1,3,5,7-tetramethylcyclotetrasiloxane (TMCTS) $(—SiH(CH_3)—O—)_4$-cyclic, octamethyl cyclotetrasiloxane (OMCTS) $(—Si(CH_3)_2—O—)_4$-cyclic, and 1,3,5,7,9-pentamethyl-cyclopentasiloxan $(—SiH(CH_3)—O—)_5$-cyclic.

The above-discussed precursor gases are examples of a film deposition gas containing a silicon compound.

Second Embodiment

Figure 8:
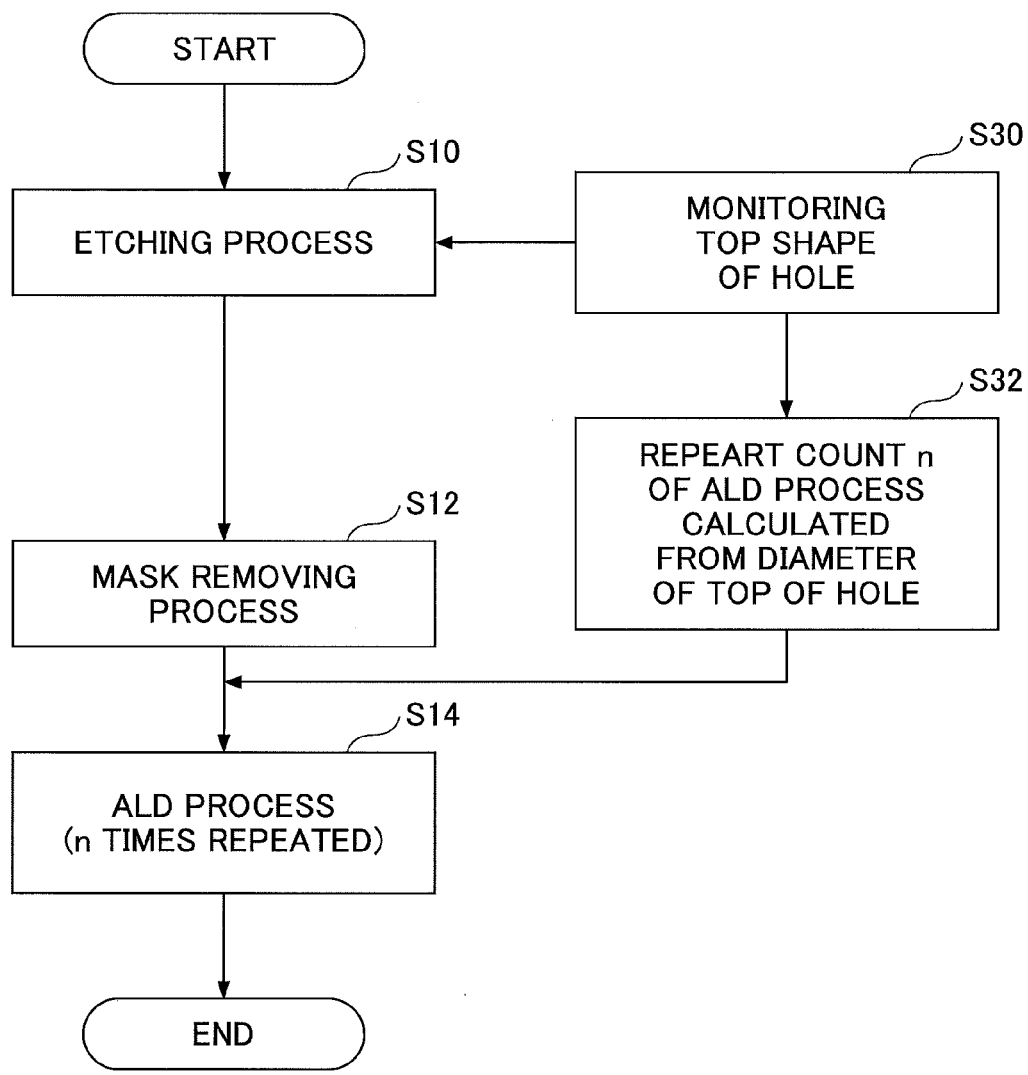
FIG. 8 is a flowchart illustrating a pattern forming process according to the second embodiment.

Next, a description is given below of a method of forming a pattern according to a second embodiment with reference to FIG. 8. FIG. 8 is a flowchart illustrating a process of forming a pattern according to the second embodiment. In the process of forming the pattern according to the second embodiment, a process of calculating a repeat count of the ALD process in steps S30 and S32 is performed in addition to steps S10, S12 and S14 of the process of forming the pattern according to the first embodiment illustrated in FIG. 4.

In other words, in the process of forming the pattern according to the second embodiment, at step S30, a shape of an etched hole is monitored while or after performing the etching process of step S10. In step S32, a diameter of the etched hole is calculated based on the result of the monitor; a film thickness to be deposited on a surface of the hole is calculated depending on the calculated diameter of the hole; and the repeat count n of the ALD process corresponding to the calculated film thickness is calculated.

After that, one cycle constituted of steps S20, S22, S24 and S26 called in step S14 is repeated a number of times of the repeat count n calculated in step S32. In other words, the number of times of step S28 is determined based on the repeat count n.

According to the embodiment, a shape of the etched hole is monitored, and the repeat count of the film deposition process by the ALD is variably controlled depending on the etching process status based on the monitoring results. This makes it possible to adjust the film thickness depending on the dispersion of the actual hole shape during the etching. In other words, a silicon-containing layer can be deposited on the surface of the hole depending on the actual shape of the hole. This allows the hole diameter and the hole shape to be modified with a further high degree of accuracy.

As discussed above, a detailed description has been given of the method of forming the pattern according to the first and second embodiments. According to the first and second embodiments, the hole diameter and the hole shape can be repaired by the film deposition process performed after the etching.

The patterns of the deep holes including the modifying film 29 formed in the first and second embodiments become a mold when forming an electrode or a capacitor. According to the method of forming the pattern of the first and second embodiments, when forming the electrode or the capacitor, because the modifying film 29 is formed densely by the ALD method, the modifying film 29 is not peeled from the silicon-containing film 30 (the silicon oxide film 26 or the silicon nitride film 27) that is an object to be etched. Hence, after forming the electrode and the capacitor, the modifying film 29 can be promptly removed at the same time when the silicon-containing film 30 (the silicon oxide film 26 and the silicon nitride film 27) is removed.

[Substrate Processing System]

Figure 9:
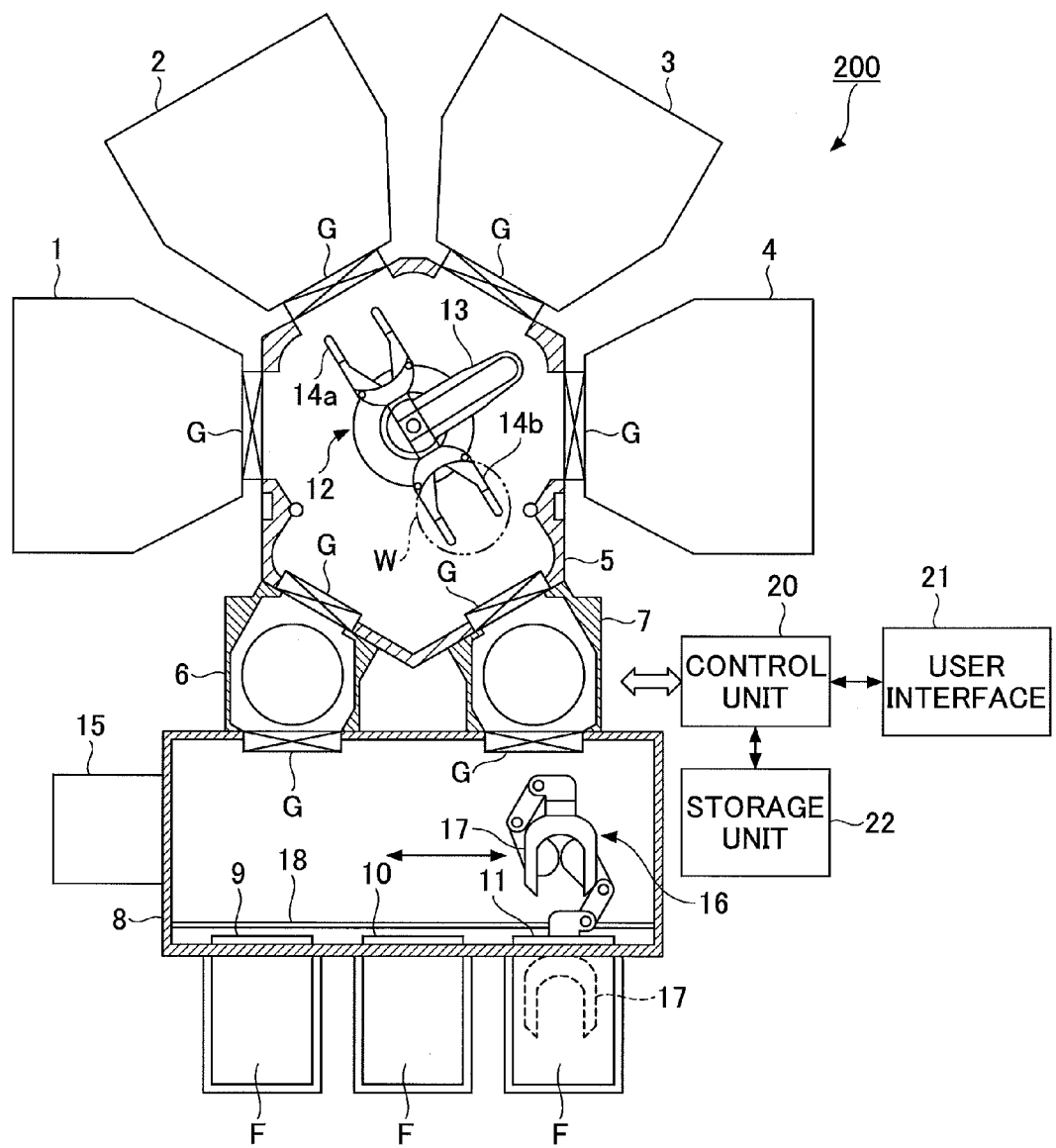
FIG. 9 is a configuration diagram illustrating a substrate processing system according to the first and second embodiments.

Next, a description is given below of an example of a substrate processing system to perform the method of forming the pattern according to the first and second embodiment with reference to FIG. 9. FIG. 9 is a configuration example of the substrate processing system according to the first and second embodiments. The substrate processing system 200 performs steps of S10, S12 and S14 of FIGS. 4 and 8, and can perform the process of steps S30 and S32 of FIG. 8 on a substrate having a layered film formed thereon illustrated in "(a) INITIAL STATE" of FIG. 3.

The substrate processing system 200 includes an etching apparatus 1 that performs the etching process (step S10) and the mask removing process (step S12), and a film deposition apparatus 2 that performs a film deposition process (step S14) by the ALD after the mask removing process. Processing apparatuses 3 and 4 may be configured as apparatuses that perform the etching process and the film deposition process.

The etching apparatus 1, the film deposition apparatus 2 and the processing apparatus 3 and 4 are provided at four sides of a transfer chamber 5 forming a hexagon corresponding thereto. Moreover, load lock chambers 6 and 7 are provided at the other two sides of the transfer chamber 5, respectively. A carry-in/out chamber 8 is provided opposite to the load lock chambers 6 and 7. Ports 9, 10 and 11 to which three FOUPs (Front-Opening Unified Pod) F that can accommodate wafers W are attached are provided in the carry-in/out chamber 8 on the side opposite to the load lock chambers 6 and 7.

The etching apparatus 1, the film deposition apparatus 2, the processing apparatuses 3 and 4, and the load lock chambers 6 and 7 are connected to each of the sides of the hexagon of the transfer chamber 5 through gate valves G. Each of the chambers is in communication with the transfer chamber 5 by opening each of the gate valves G and blocked from the transfer chamber 5 by closing each of the gate valves G. Furthermore, gate valves G are provided at portions where the load lock chambers 6 and 7 are connected to the carry-in/out chamber 8. The load lock chambers 6 and 7 are communicated with the carry-in/out chamber 8 by opening the gate valves G and blocked from the carry-in/out chamber 8 by closing the gate valves G.

A transfer device 12 is provided in the transfer chamber 5 to carry the wafers W into/out of the etching apparatus 1, the film deposition apparatus 2, the processing apparatus 3 and 4, and the load lock chambers 6 and 7. The transfer device 12 is installed in approximately the center of the transfer chamber 5, and includes two blades 14a and 14b at the tip of a rotation and extension part 13 that is rotatable and extendable for holding the wafer W. The blades 14a and 14b are attached to the rotation and extension part 13 so as to face an opposite direction. Here, the inside of the transfer chamber 5 can be kept at a predetermined degree of vacuum.

In addition, a HEPA filter (not shown in the drawing) is provided at a ceiling part of the carry-in/out chamber 8. Clean air from which organic substances, particles and the like are removed by passing through the HEPA filter is supplied into the carry-in/out chamber 8 in a downflow state. Because of this, the wafer W is carried into/out of the carry-in/out chamber 8 in a clean air atmosphere having atmospheric pressure. Three of the ports 9, 10 and 11 of the carry-in/out chamber 8 for receiving the FOUP F include shutters (not shown in the drawing), respectively. The FOUP F accommodating the wafers W or without the wafer W is directly attached to the ports 9, 10 and 11, and is communicated with the carry-in/out chamber 8 by causing the shutter to be unfastened when attached to the ports 9, 10 and 11 while preventing the external air from intruding into the carry-in/out chamber 8. In addition, an alignment chamber 15 is provided on a side surface of the carry-in/out chamber 8, and the alignment of the wafer W is performed in the alignment chamber 15.

A transfer device 16 for carrying the wafer W into/out of the FOUP F and the load lock chambers 6 and 7 is provided in the carry-in/out chamber 8. The transfer device 16 has two multiple joint arms, and is structured to be able to run on a rail 18 along an arrangement direction of the FOUP F. The conveyance of the wafer W is performed by placing the wafer W on the tip of a fork 17. Here, FIG. 9 illustrates a state of one fork 17 provided in the carry-in/out chamber 8 and the other fork inserted into the FOUP F.

Components of the substrate processing system 200 (e.g., the etching apparatus 1, the film deposition apparatus 2, the processing apparatuses 3 and 4, and the transfer device 12 and 16) are connected to a control unit 20 constituted of a computer, and are configured to be controlled. Moreover, a user interface 21 constituted of a keyboard to allow an operator to perform input operation of a command and the like for managing the system, a display for displaying and visualizing an operational status and the like are connected to the control unit 20.

The control unit 20 is further connected to a storage unit 22 storing a control program to cause the control by the control unit 20 to implement various processes illustrated in FIGS. 4, 5 and 8 executable by the system and a program to cause each of the components to execute a process depending on processing conditions (i.e., a process recipe). The process recipe is stored in a storage medium in the storage unit 22. The storage medium may be a hard disk, or may be a portable medium such as a CD-ROM, a DVD, a flash memory or the like. Furthermore, a configuration of transmitting the recipe at the right time from another device, for example, through a dedicated line is also possible.

The process in the substrate processing system 200 is, for example, implemented by calling any process recipe from the storage unit 22 by an instruction or the like from the user interface 21 and causing the control unit 20 to execute the process recipe. Here, the control unit 20 may directly control each of the components, or may provide an individual controller for each of the components and control each of the components through the controller.

In the substrate processing system 200 according to the embodiment of the present invention, to begin with, a FOUP F accommodating wafers W on which a pretreatment has been performed is loaded. Next, the transfer device 16 in the carry-in/out chamber 8 kept at a clean air atmosphere having atmospheric pressure takes a wafer W from the FOUP F and carries the wafer W into the alignment chamber 15, where the wafer W is aligned. Subsequently, the transfer device 16 carries the wafer W into one of the load lock chambers 6 and 7, and one of the load lock chambers 6 and 7 including the wafer W is evacuated. The transfer device 12 in the transfer chamber 5 takes the wafer W out of one of the load lock chambers 6 and 7, and loads the wafer W in the etching apparatus 1. The etching apparatus 1 performs the etching process of step S10, and then performs the mask removing process of step D12 when the mask is a resist mask. After that, the transfer device 12 takes the wafer W out of the etching device 1, and carries the wafer W into the film deposition apparatus 2. The film deposition apparatus 2 deposits a modifying film 29 on the wafer W by the ALD method while performing the plasma treatment. Then, the transfer device 12 carries the wafer W out of the film deposition apparatus 2 and carries the wafer W into one of the load lock chambers 6 and 7, and the pressure in one of the load lock chambers 6 and 7 holding the wafer W is returned to atmospheric pressure. The transfer device 16 takes the wafer W out of one of the load lock chambers 6 and 7, and carries the wafer W into any of the FOUPs F. The above-mentioned operation is performed for one lot of the wafers W, and a set of processes is ended.

[Configuration Example of Etching Apparatus]

Figure 10:
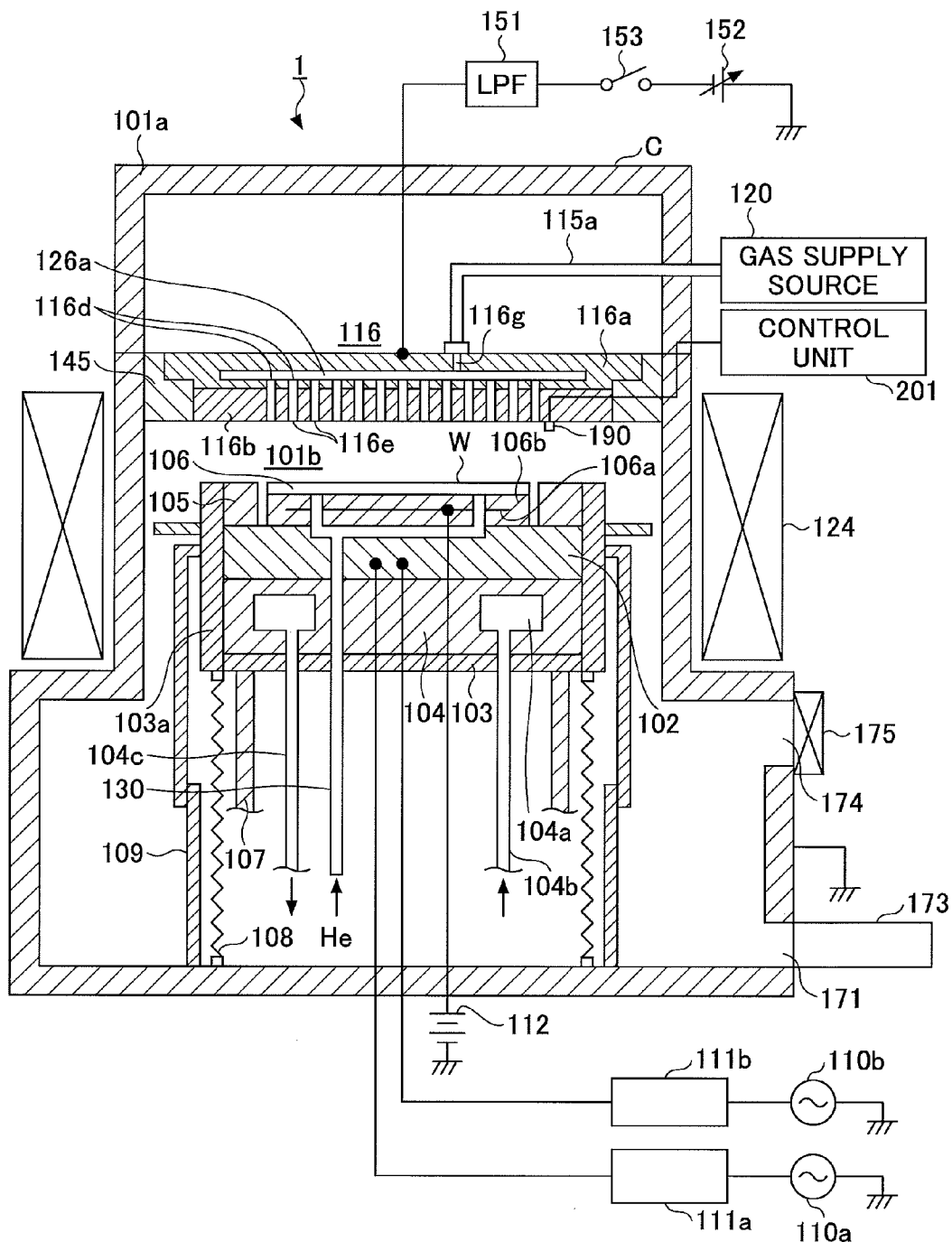
FIG. 10 is a configuration diagram illustrating an etching apparatus according to the first and second embodiments.

Next, a description is given below of an example of an internal configuration of the etching apparatus 1 in the substrate processing system 200 based on FIG. 10. FIG. 10 illustrates a configuration example of the etching apparatus 1 that performs the etching process of step S10 of FIGS. 4 and 8 in the first and second embodiments.

The inside of the etching apparatus 1 is kept hermetically sealed, and includes a chamber C that is electrically grounded. The etching apparatus 1 is connected to a gas supply source 120. The gas supply source 120 supplies an etching gas including a fluorocarbon (CF) gas as an etching gas. The fluorocarbon gas may contain hexafluoro-1,3-butadiene ($C_4F_6$) gas.

The chamber C has a cylindrical shape, and for example, is made of aluminum whose surface is anodized, and includes a susceptor 102 therein to support a wafer W. The susceptor 102 functions as even a lower electrode.

The susceptor 102 is supported by a conductive support 104, and is configured to be able to elevate and descend by an elevating mechanism 107 through an insulating plate 103.

The elevating mechanism 107 is provided in the chamber C, and is covered with a bellows 108 made of stainless steel.

A bellows cover 109 is provided outside the bellows 108. A focus ring 105, for example, made of monocrystalline silicon, is provided on the susceptor 102 and on the outer circumference side of the susceptor 102. Furthermore, a cylindrical inner wall member 103a, for example, made of quartz or the like is provided so as to surround the susceptor 102 and the support 104.

A first high frequency power source 110a is connected to the susceptor 102 through a first matching box 111a, and high frequency power for plasma generation of a predetermined frequency (e.g., 60 MHz) is supplied to the susceptor 102 from the first high frequency power source 110a. In addition, a second high frequency power source 110b is connected to the susceptor 102 through a second matching box 111b, and high frequency power for bias of a predetermined frequency (e.g., 400 kHz) is supplied to the susceptor 102 from the second high frequency power source 110b. On the other hand, a shower head 116 that functions as an upper electrode is provided above the susceptor 102 so as to face the susceptor 102 in parallel, and the shower head 116 and the susceptor 102 are configured to function as a pair of electordes. An electrostatic chuck 106 is provided on the upper surface of the susceptor 102 to electrostatically attract the wafer W thereon. The electrostatic chuck 106 includes an electrode 106a intervening in an insulator 106b. A direct current voltage source 112 is connected to the electrode 116a, and the wafer W is attracted on the electrostatic chuck 106 by applying a direct current voltage to the electrode 106a from the direct current voltage source 112.

A coolant passage 104a is formed inside the support 104. A coolant inlet pipe 104b and a coolant outlet pipe 104c are connected to the coolant passage 104a. By circulating, for example, cool water or the like in the coolant passage 104a as a coolant, the wafer W is controlled to become a predetermined temperature. A pipe 130 is provided in the electrostatic chuck 106 to supply a cool transmission gas (a backside gas) such as helium gas (He) to the back side of the wafer W.

The shower head 116 is provided in a ceiling part of the chamber C. The shower head 116 includes a main body 116a and an upper ceiling plate 116b that forms an electrode plate. The shower head 116 is held in an upper part of the chamber C through an insulating member 145. The main body 116a is made of a conductive material, for example, aluminum whose surface is anodized, and holds the upper ceiling plate 116b on the lower surface detachably.

A gas diffusion chamber 126a is provided inside the main body 116a, and many gas circulation holes 116d are formed in a bottom part of the main body 116a so as to be located at a position under the diffusion chamber 126a. Gas introduction holes 116e are provided in the upper ceiling plate 116b so as to penetrate the upper ceiling plate 116b in a thickness direction and to be communicated with the gas circulation holes 116d. According to such a configuration, a gas supplied to the diffusion chamber 126a is introduced into a plasma processing space in the chamber C through the gas circulation holes 116d and the gas introduction holes 116e in a shower form. Here, a pipe not shown in the drawing for circulating the coolant is provided in the main body 116a and the like, and the shower head 116 is adjusted to a desired temperature by cooling the shower head 116.

A gas introduction port 116g to introduce a gas into the diffusion chamber 126a is formed in the main body 116a. The gas supply source 120 is connected to the gas introduction port 116g.

A variable direct current voltage source 152 is connected to the shower head 116 through a low pass filter (LPF) 151. The variable direct current voltage power source 152 is configured to be able to turn on and off power supply by an on-off switch 153. When high frequency power is supplied from the first high frequency power source 110a and the second high frequency power source 110b to the susceptor 102 and plasma is generated in the plasma processing space, the on-off switch 153 is controlled to turn on as necessary. This causes a predetermined direct current voltage to be applied to the shower head 116.

A cylindrical grounded conductor 101a is provided so as to extend upward from the side wall of the chamber C to a position higher than the height position of the shower head 116. This cylindrical grounded conductor 101a includes a ceiling plate at the upper part thereof. An exhaust port 171 is formed in a part close to the bottom of the chamber C. An exhaust device 173 is connected to the exhaust port 171. The exhaust device 173 includes a vacuum pump, and reduces the pressure within the chamber C to a predetermined degree of vacuum by operating the vacuum pump. In the meantime, a gate valve 175 is provided on the side wall of the chamber C to allow the wafer W to be carried into or out of a carry-in/out opening 174 by being opened and closed.

A dipole ring magnet 124 extending annularly or concentrically is arranged around the chamber C at a position corresponding to a processing position of the susceptor 102 in a vertical direction during the process.

According to such a configuration, an RF (Radio Frequency) field is formed in the vertical direction by the first high frequency power source 110a in a space between the susceptor 102 and the shower head 116, and a horizontal magnetic field is formed by the dipole ring magnet 124. A magnetron discharge using the crossed electromagnetic field makes it possible to generate high density plasma in the vicinity of a surface of the susceptor 102.

A scatterometer 190 is provided inside the chamber C as an example of a CD measuring instrument. The scatterometer 190 measures a CD of the hole during the etching by light scattering measurement. An ellipsometer or a CD-SEM can be also used as another example of the CD measuring instrument.

A control unit 201 controls a whole of the etching apparatus 1 such as a gas flow rate in the gas supply source 120, the pressure in the chamber C and the like. Moreover, a CD value of the hole during the etching measured by the scatterometer 190 is input to the control unit 201, and the control unit 201 calculates a repeat count or a repetition time of a cycle constituted of a film deposition process (steps S20, S22, S24 and S26 of FIG. 5) based on the input CD value. According to this, the repeat count or the repetition time of the cycle can be controlled variably depending on the measured CD value. This makes it possible to deposit a silicon-containing layer having a film thickness depending on an actual shape of a hole formed by etching on a surface of the hole. This allows a hole diameter and a hole shape to be repaired precisely.

[Film Deposition Apparatus]

Figure 11:
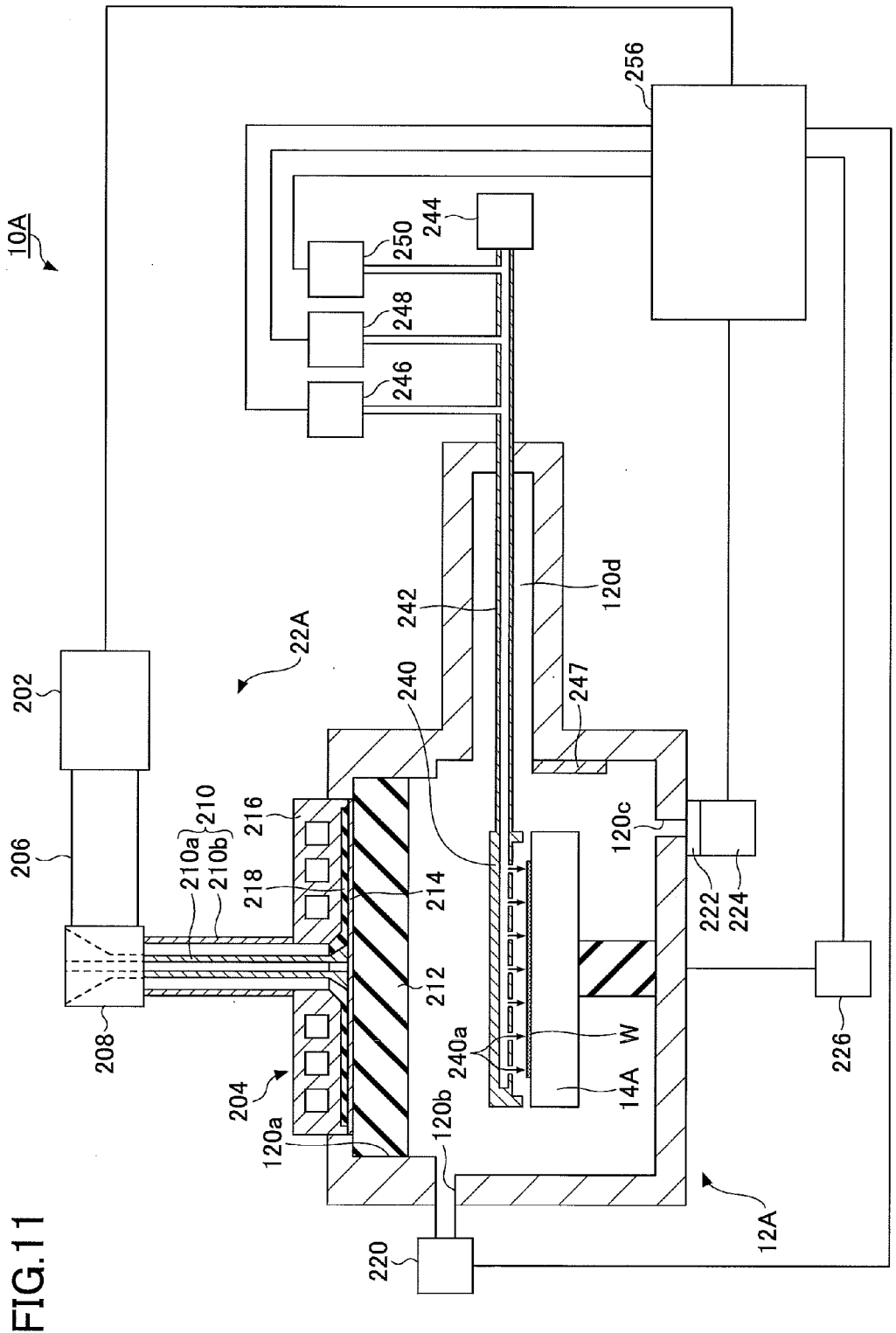
FIG. 11 is a configuration diagram illustrating a film deposition apparatus according to the first and second embodiments.

Next, a description is given below of an example of the film deposition apparatus 1 included in the substrate processing system with reference to FIG. 11. FIG. 11 illustrates a configuration example of the film deposition apparatus 10A that performs the film deposition process by the ALD of step S14 in FIGS. 4 and 8 according to the first and second embodiments. More specifically, the film deposition apparatus 1 is one that performs each process of the flowchart in FIG. 5.

The film deposition apparatus 10A illustrated in FIG. 11 is a single wafer processing film deposition apparatus, and includes a processing head to supply a precursor gas. More specifically, the film deposition apparatus 10A includes a process chamber 12A, a suceptor 14A for holding a wafer W in the process chamber 12A, and a plasma generation unit 22A for generating plasma of a reactive gas within the process chamber 12A.

The plasma generation unit 22A includes a microwave generator 202 for generating a microwave, and a radial line slot antenna 204 for introducing the microwave into the process chamber 12A. The microwave generator 202 is connected to a mode converter 208 for converting a mode of the microwave through a waveguide 206. The mode converter 208 is connected to the radial line slot antenna 204 through a coaxial waveguide 210 including an inner waveguide 210a and an outer waveguide 210b. A mode of the microwave generated by the microwave generator 202 is converted by the mode converter 208, and the converted microwave reaches the radial line slot antenna 204. A frequency of the microwave generated by the microwave generator 202 is, for example, 2.45 GHz.

The radial line slot antenna 204 includes a dielectric window 212 for blocking an opening 120a formed in the process chamber 12A, a slot plate 214 provided directly above the dielectric window 212, a cooling jacket 216 provided above the slot plate 214, and a dielectric plate 218 arranged between the slot plate 214 and the cooling jacket 216. The slot plate 214 has an approximately disc shape. A plurality of slot pairs including two slot holes extending in a direction perpendicular to each other or crossing each other are provided in the slot plate 214 so as to be arranged in a radial direction and a circumferential direction of the slot plate 214.

The dielectric window 212 is provided to face the wafer W. The inner waveguide 210a is connected to the center of the slot plate 214, and the outer waveguide 210b is connected to the cooling jacket 216. The cooling jacket 216 also functions as the waveguide. This causes the microwave transmitted between the inner waveguide 210a and the outer waveguide 210b to go through the dielectric plate 218, to be transmitted to the dielectric window 212 by passing the slot holes of the slot plate 214, and to be introduced into the process chamber 12A by going through the dielectric window 212.

A supply port 120b of the reactive gas is formed in the side wall of the process chamber 12A. A supply source 220 of the reactive gas is connected to the supply port 120b. When a silicon oxide film is deposited on the wafer W in the above-mentioned plasma treatment process in FIG. 5, an oxidation gas, for example, oxygen gas ($O_2$) is supplied into the process chamber 12A together with argon gas (Ar) or the like as the reactive gas. Furthermore, when depositing a silicon nitride film, a nitriding gas such as nitrogen gas ($N_2$) or ammonia gas ($NH_3$) is supplied into the process chamber 12A together with argon gas (Ar). In the film deposition apparatus 10A, the plasma of the reaction gas is generated by causing the reaction gas to be ionized or to dissociate by the electric field energy of the microwave transmitted along the lower surface of the dielectric window 212 as a surface wave. This causes the plasma treatment process in FIG. 4 (step S24) to be performed on the wafer W.

An exhaust port 120c for exhausting the gas in the process chamber 12A is formed in the bottom of the process chamber 12A. A vacuum pump 224 is connected to the exhaust port 120c through a pressure regulator 222.

The exhaust port 120c, the pressure regulator 222 and the vacuum pump 224 are provided as an exhaust device. A temperature regulator 226 for adjusting a temperature of the susceptor 14A is connected to the suceptor 14A.

The film deposition apparatus 10A further includes a head part 240 having discharge holes formed therein for injecting a first precursor gas, a second precursor gas and a purge gas. The head part 240 is connected to a drive unit 244 through a support 242. The drive unit 242 is arranged outside the process chamber 12A. The head part 240 can be moved between a position facing the susceptor 14A and a retreat space 120d formed in the process chamber 12A by the drive unit 244. Here, when the head part 240 is located within the retreat space 120d, a shutter 247 moves to separate the retreat space 120d.

The support 242 forms a gas supply passage for supplying a gas to the discharge holes 240a, and a supply source 246 of the first precursor gas, a supply source 248 of the second precursor gas, and a supply source 250 of the purge gas are connected to the gas supply passage formed by the support 242. Any of the supply sources 246, 248 and 250 is a gas supply source that can control a flow rate. Accordingly, the head part 240 can selectively inject the first precursor gas, the second precursor gas and the purge gas to the wafer W. This head part 240 and the above-mentioned exhaust device cause the gas adsorption process (step S20) by the precursor gas and the first and second exhaust process (step S22 and step S26) by the purge gas in FIG. 5 to be implemented.

In addition, the film deposition apparatus 10A includes a control unit 256. The control unit 256 is connected to the microwave generator 202, the vacuum pump 224, the temperature regulator 226, the drive unit 244, and the gas supply sources 220, 246, 248 and 250. This enables the control unit 256 to control each of the microwave output, the pressure inside the process chamber 12A, the temperature of the susceptor 14A, the movement of the head part 240, the gas flow rate and the supply timing of the reactive gas, the first precursor gas, the second precursor gas and the purge gas. For example, when performing the gas adsorption process (step S20) and the first exhaust process (step S22), the head part 240 is moved to a position above the wafer W, and each of the processes are performed. After that, the head part 240 is moved to the position above the wafer W again, and the second exhaust process (step S26) is performed. These processes are performed a predetermined number of times, by which the ALD process is performed.

The head part 240 of the film deposition apparatus 10A can form a small space to which the first precursor gas, the second precursor gas and the purge gas can be supplied between the susceptor 14A and the head part 240. Moreover, the plasma of the reactive gas can be generated in the process chamber 12A all the time. According to such a film deposition apparatus, the space to which the precursor gas is supplied can be made small, and the plasma of the reactive gas can be generated in the process chamber 12A all the time, which makes it possible to implement high throughput.

Furthermore, a precursor gas of BTBAS (bis-tertiaryl-buthyl-amino-silane) may be used as the first precursor gas. In addition, dichlorosilane (DCS) may be used as the second precursor gas. Moreover, silane, disilane, methylsilane H4, or PH3 may be used instead of dichlorosilane. Furthermore, argon (Ar) gas, nitrogen ($N_2$) gas or the like is used as the purge gas.

Although preferred embodiments of a method of forming a pattern and a substrate processing system are described above with reference to the accompanying drawings, the scope of the method of forming the pattern and the substrate processing system is not limited to such embodiments. That is, numerous variations and modifications will readily occur to those skilled in the art, and the present invention includes all such variations and modifications that may be made without departing from the scope of the present invention. Moreover, a plurality of the embodiments, variations and modifications can be combined with each other as far as the combination does not cause any contradiction.

A film deposition process used in a method of forming a pattern of the present invention may be implemented by plasma CVD instead of a film deposition process by an ALD method.

Moreover, although an etching process and a film deposition process are performed by different processing apparatuses separately in a substrate processing system of the present invention, both of the etching process and the film deposition process may be perfouned by a single processing apparatus.

Furthermore, an object to be processed by a substrate processing system of the present invention is not limited to a wafer, but may be a substrate having a predetermined dimension.

The present application is based on and claims the benefit of priority of Japanese Patent Application No. 2012-155359 filed on Jul. 11, 2012, and U.S. Provisional Application No. 61/672,399 filed on Jul. 17, 2012, the entire contents of which are herein incorporated by reference.

DESCRIPTION OF THE REFERENCE NUMERALS 1 etching apparatus
2 film deposition apparatus
3, 4 processing apparatus
25 substrate
26 silicon oxide film
27 silicon nitride film
28 poly-silicon mask
29 modifying film
30 silicon-containing film
200 substrate processing system

The invention claimed is:

1. A method of forming a pattern, comprising steps of:
    forming a predetermined pattern in a silicon-containing film by etching the silicon-containing film deposited on a substrate through a mask by plasma generated from an etching gas containing a fluorocarbon gas; and
    depositing a silicon oxide film or a silicon nitride film on a surface of the predetermined pattern formed by etching the silicon-containing film by oxidizing or nitriding a silicon-containing layer adsorbed on the etched surface of the predetermined pattern by supplying a silicon compound gas, by using plasma generated from an oxidation gas or a nitriding gas after the step of forming the predetermined pattern in the silicon-containing film by the etching.

2. The method as claimed in claim 1, wherein the step of depositing the silicon oxide film or the silicon nitride film on the surface of the predetermined pattern includes
    a step of adsorbing silicon (Si) contained in a precursor gas on the surface of the predetermined pattern by supplying the precursor gas containing silicon as the silicon compound gas, and
    a step of supplying a reactive gas and depositing the silicon oxide film or the silicon nitride film by oxidizing or nitriding the silicon-containing layer adsorbed on the predetermined pattern by the plasma generated from the reactive gas.

3. The method as claimed in claim 2, wherein the step of depositing the silicon oxide film or the silicon nitride film on the surface of the predetermined pattern further comprises:

purging the surface of the predetermined pattern by supplying a purge gas to the surface of the predetermined pattern after the step of adsorbing silicon (Si) contained in the precursor gas on the surface of the predetermined pattern and before the step of supplying the reactive gas and depositing the silicon oxide film or the silicon nitride film; and purging the surface of the predetermined pattern by supplying the purge gas to the surface of the predetermined pattern after the step of supplying the reactive gas and depositing the silicon oxide film or the silicon nitride film.

4. The method as claimed in claim 2, wherein performing each of the step of adsorbing silicon (Si) contained in the precursor gas on the surface of the predetermined pattern and the step of supplying the reactive gas and depositing the silicon oxide film or the silicon nitride film once is made one cycle unit, and the cycle unit is repeated a predetermined number of times or for a predetermined repetition time.

5. The method as claimed in claim 4, wherein the step of forming the predetermined pattern in the silicon-containing film by etching the silicon-containing film on the substrate includes a step of measuring a shape of the predetermined pattern, and a step of calculating the predetermined number of times or the predetermined repetition time based on a measured result in the step of measuring the shape of the predetermined pattern, and the cycle unit is repeated the calculated predetermined number of times or for the calculated repetition time.

6. The method as claimed in claim 2, wherein BTBAS (bis-tertiaryl-buthyl-amino-silane) or dichlorosilane is supplied as the precursor gas.

7. The method as claimed in claim 1, wherein one of the oxidation gas and the nitriding gas is selected depending on a sort of the silicon-containing film in which the predetermined pattern is formed, and the selected one of the oxidation gas and the nitriding gas is supplied to the silicon-containing layer adsorbed on the predetermined pattern.

8. The method as claimed in claim 1, further comprising a step of:

removing the mask after forming the predetermined pattern immediately after the step of forming the predetermined pattern in the silicon-containing film.

9. A substrate processing system comprising:

an etching apparatus configured to form a predetermined pattern in a silicon-containing film by plasma generated from an etching gas containing fluorocarbon gas by etching the silicon-containing film on a substrate through a mask; and a film deposition apparatus configured to deposit a silicon oxide film or a silicon nitride film on a surface of the predetermined pattern formed by the etching apparatus by oxidizing or nitriding a silicon-containing layer adsorbed on the etched surface of the predetermined pattern by supplying a silicon compound gas, by using plasma generated from an oxidation gas or a nitriding gas after the predetermined pattern is formed in the silicon-containing film by the etching apparatus.

\* \* \* \* \*